US011302808B2

(12) United States Patent
Radosavljevic et al.

(10) Patent No.: US 11,302,808 B2
(45) Date of Patent: Apr. 12, 2022

(54) III-V TRANSISTORS WITH RESISTIVE GATE CONTACTS

(71) Applicant: Intel Corporation, Santa Clara, CA (US)

(72) Inventors: Marko Radosavljevic, Portland, OR (US); Sansaptak Dasgupta, Hillsboro, OR (US); Han Wui Then, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 34 days.

(21) Appl. No.: 16/645,119

(22) PCT Filed: Dec. 29, 2017

(86) PCT No.: PCT/US2017/068996
§ 371 (c)(1),
(2) Date: Mar. 6, 2020

(87) PCT Pub. No.: WO2019/132985
PCT Pub. Date: Jul. 4, 2019

(65) Prior Publication Data
US 2021/0167200 A1 Jun. 3, 2021

(51) Int. Cl.
*H01L 29/778* (2006.01)
*H01L 21/8252* (2006.01)
(Continued)

(52) U.S. Cl.
CPC ...... *H01L 29/7787* (2013.01); *H01L 21/8252* (2013.01); *H01L 29/401* (2013.01);
(Continued)

(58) Field of Classification Search
CPC ........... H01L 29/7787; H01L 29/66462; H01L 29/7783; H01L 29/66431; H01L 29/7786; H01L 29/4916
See application file for complete search history.

(56) References Cited

U.S. PATENT DOCUMENTS

2014/0302797 A1* 10/2014 Han ....................... H03F 3/245
455/67.14
2015/0034906 A1 2/2015 Xiao
(Continued)

FOREIGN PATENT DOCUMENTS

WO WO-2017171851 A1 * 10/2017 ....... H01L 29/78391

OTHER PUBLICATIONS

International Search Report and Written Opinion for International Patent Application No. PCT/US2017/068996, dated Jul. 9, 2020, 10 pgs.
(Continued)

*Primary Examiner* — Joseph C. Nicely
(74) *Attorney, Agent, or Firm* — Schwabe, Williamson & Wyatt, P.C.

(57) ABSTRACT

Embodiments herein describe techniques, systems, and method for a semiconductor device that may include an III-V transistor with a resistive gate contact. A semiconductor device may include a substrate, and a channel base including a layer of GaN above the substrate. A channel stack may be above the channel base, and may include a layer of GaN in the channel stack, and a polarization layer above the layer of GaN in the channel stack. A gate stack may be above the channel stack, where the gate stack may include a gate dielectric layer above the channel stack, and a resistive gate contact above the gate dielectric layer. The resistive gate contact may include silicon (Si) or germanium (Ge). Other embodiments may be described and/or claimed.

26 Claims, 14 Drawing Sheets

(51) Int. Cl.
   *H01L 29/40* (2006.01)
   *H01L 29/417* (2006.01)
   *H01L 29/51* (2006.01)
   *H01L 29/66* (2006.01)
   *H01L 29/49* (2006.01)

(52) U.S. Cl.
   CPC .... *H01L 29/41725* (2013.01); *H01L 29/4916* (2013.01); *H01L 29/517* (2013.01); *H01L 29/66431* (2013.01); *H01L 29/66462* (2013.01); *H01L 29/7783* (2013.01); *H01L 29/7786* (2013.01)

(56) References Cited

U.S. PATENT DOCUMENTS

| | | | |
|---|---|---|---|
| 2015/0221757 A1* | 8/2015 | Nakayama | H01L 27/0605 257/20 |
| 2016/0351564 A1 | 12/2016 | Azize | |
| 2017/0125571 A1* | 5/2017 | Huang | H01L 29/2003 |
| 2017/0294307 A1* | 10/2017 | Caimi | H01L 29/78696 |

OTHER PUBLICATIONS

Search Report European Patent Application No. 17936377.5, dated Jul. 13, 2021, 9 pgs.

* cited by examiner

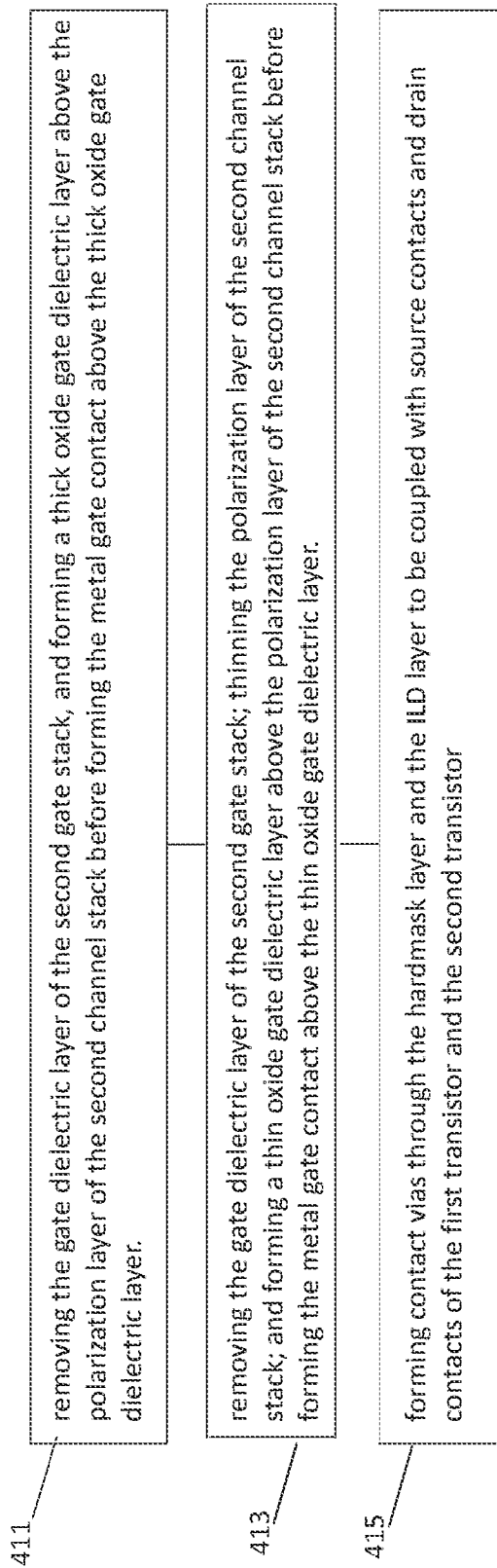

Figure 4B

411 — removing the gate dielectric layer of the second gate stack, and forming a thick oxide gate dielectric layer above the polarization layer of the second channel stack before forming the metal gate contact above the thick oxide gate dielectric layer.

413 — removing the gate dielectric layer of the second gate stack; thinning the polarization layer of the second channel stack; and forming a thin oxide gate dielectric layer above the polarization layer of the second channel stack before forming the metal gate contact above the thin oxide gate dielectric layer.

415 — forming contact vias through the hardmask layer and the ILD layer to be coupled with source contacts and drain contacts of the first transistor and the second transistor

III-V TRANSISTORS WITH RESISTIVE GATE CONTACTS

CROSS-REFERENCE TO RELATED APPLICATION

This patent application is a U.S. National Phase Application under 35 U.S.C. § 371 of International Application No. PCT/US2017/068996, filed Dec. 29, 2017, entitled "III-V TRANSISTORS WITH RESISTIVE GATE CONTACTS," which designates the United States of America, the entire disclosure of which is hereby incorporated by reference in its entirety and for all purposes.

FIELD

Embodiments of the present disclosure generally relate to the field of integrated circuits, and more particularly, to III-V transistors.

BACKGROUND

Radio frequency (RF) integrated circuits (ICs) may include various active components, e.g., transistors, and passive components, e.g., resistors, to work together to perform the functions for a RF system. Currently, a resistor may be coupled to a gate contact of a transistor by a metal interconnect. However, such an architecture may result in a large area for the ICs.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIGS. 4A-4B illustrate a process for forming a semiconductor device including multiple III-V transistors having a resistive gate contact or a metal gate contact, in accordance with some embodiments.

DETAILED DESCRIPTION

Figure 1:
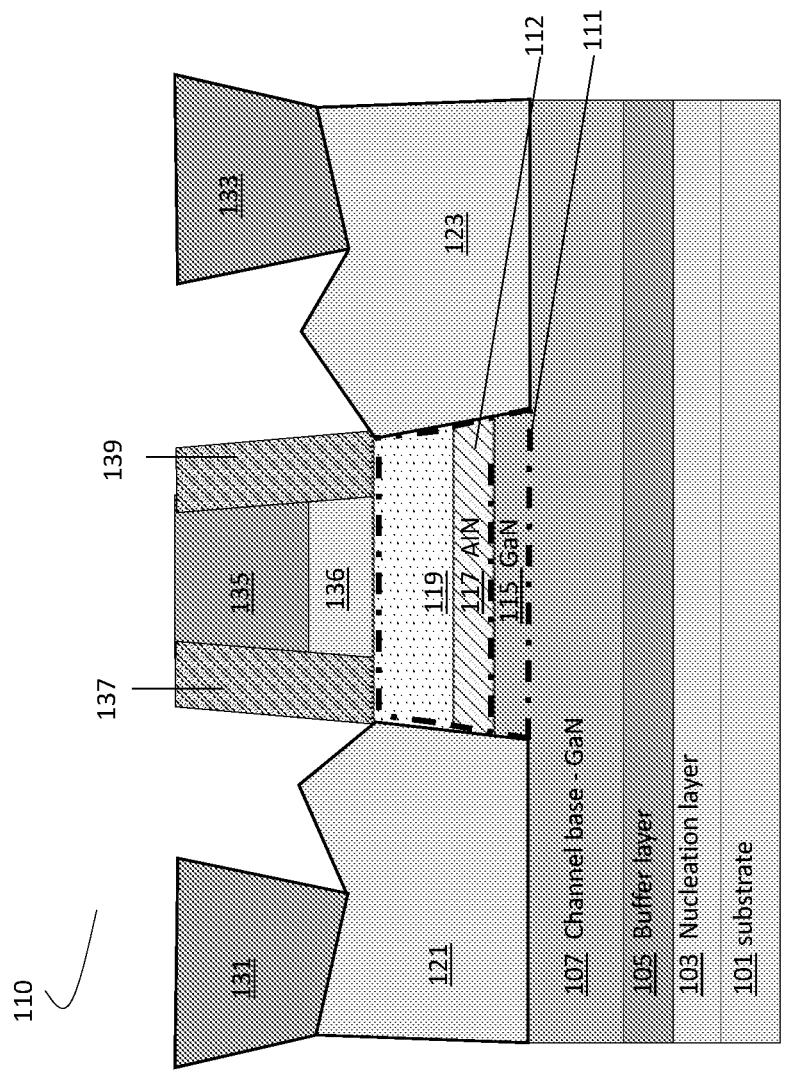
FIG. 1 schematically illustrates an example semiconductor device including an III-V transistor having a resistive gate contact, in accordance with some embodiments.

Radio frequency (RF) integrated circuits (ICs) may include various active components, e.g., transistors, and passive components, e.g., resistors, to work together to perform the functions for a RF system. High electron mobility transistors (HEMTs) may be used in advanced communications applications such as RF applications and power electronic devices. HEMTs may be formed using group II-VI, III-V, or IV materials such as GaAs, AlGaAs, or GaN. GaN HEMTs, or simply GaN transistors, may be considered as one of the leading candidates for high efficiency power switching applications or for high-speed RF communications. In the following descriptions, a GaN transistor may be used as an example of an III-V transistor. However, embodiments may include any generic III-V transistors.

In embodiments, a semiconductor device may include an III-V transistor having a resistive gate contact. The resulting semiconductor device may act as a transistor coupled to a resistor. For example, a large voltage, e.g., 18 volt, may across the resistive gate contact without breaking down the transistor. In addition, multiple III-V transistors having a resistive gate contact or a metal gate contact may be integrated together to provide RF applications and analog applications, further reducing the area for the system with improved speed.

Embodiments herein may present a semiconductor device, comprising: a substrate, and a channel base including a layer of GaN above the substrate. A channel stack may be above the channel base, and may include a layer of GaN in the channel stack, and a polarization layer above the layer of GaN in the channel stack. A gate stack may be above the channel stack, where the gate stack may include a gate dielectric layer above the channel stack, and a resistive gate contact above the gate dielectric layer. The resistive gate contact may include silicon (Si) or germanium (Ge).

Embodiments herein may present a method for forming a semiconductor device. The method may include forming a channel base including a layer of GaN above a substrate, and forming a first transistor above the channel base, and a second transistor above the channel base. The first transistor may be separated from the second transistor by an isolation area. The first transistor may include a first channel stack above the channel base, and a first gate stack above the first channel stack. The second transistor may include a second channel stack above the channel base, and a second gate stack above the second channel stack. The first channel stack or the second channel stack may include a layer of GaN in the channel stack, and a polarization layer above the layer of GaN in the channel stack. The first gate stack or the second gate stack may include a gate dielectric layer above the channel stack, and a resistive gate contact above the gate dielectric layer. The resistive gate contact may include Si or Ge. The method may further include forming a hardmask layer above the first transistor and the second transistor with an opening over the second gate stack, removing the resistive gate contact of the second gate stack, and forming a metal gate contact above the gate dielectric layer of the second gate stack. The method may further including forming an interlayer dielectrics (ILD) layer above the hardmask layer, covering the metal gate contact and the opening over the second gate stack.

Embodiments herein may present a computing device. The computing device may include a control circuit and a power electronic device coupled to the control circuit. The power electronic device or the control circuit may include a transistor. The transistor may include a substrate, a channel base including a layer of GaN above the substrate, and a channel stack above the channel base. The channel stack may include a layer of GaN in the channel stack, and a polarization layer above the layer of GaN in the channel stack. The transistor may further include a gate stack above the channel stack, where the gate stack may include a gate dielectric layer above the channel stack, and a resistive gate contact above the gate dielectric layer. The resistive gate contact may include Si or Ge.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. These may be doped in situ with suitable dopants such as silicon and carbon. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIG. 1 schematically illustrates an example semiconductor device including an III-V transistor 110 having a resistive gate contact 135, in accordance with some embodiments. For clarity, features of the III-V transistor 110 and the resistive gate contact 135 may be described below as examples for understanding an III-V transistor and a resistive gate contact. Further, it is to be understood that one or more of the components of an III-V transistor and a resistive gate contact may include additional and/or varying features from the description below, and may include any device that one having ordinary skill in the art would consider and/or refer to as an III-V transistor and a resistive gate contact.

In embodiments, the III-V transistor 110 may include a substrate 101, a buffer layer 103, and a nucleation layer 105 above the substrate 101. A layer of GaN 107 may include GaN, and may be above the substrate 101, the buffer layer 103, and the nucleation layer 105. The buffer layer 103 and the nucleation layer 105 may be optional. Additionally and alternatively, there may be multiple buffer layers and/or nucleation layers between the substrate 101 and the channel base 107.

In embodiments, the III-V transistor 110 may include a channel stack 111 above the layer of GaN 107. The channel stack 111 may include a layer of GaN 115 in the channel stack 111 and a polarization layer 112 above the layer of GaN 115 in the channel stack 111. A 2DEG layer, not shown, may be formed at an interface between the layer of GaN 115 and the polarization layer 112. The 2DEG layer may be a sheet of mobile electrons in the top 1-2 nm of the GaN layer close to the interface. The polarization layer 112 may include a layer of AlInGaN 119 or a layer of AlN 117. In some embodiments, the polarization layer 112 may include both the layer of AlInGaN 119 and the layer of AlN 117, or only one of them. In some other embodiments, other polarization layer may be used as well. In some embodiments, the layer of AlInGaN 119 may include $Al_xIn_yGa_{1-x-y}N$, where x may be in a range of about 70% and 95%, y may be in a range of about 0% to 20%, and 1−x−y may be in a range of about 0% to 30%. The channel stack 111 and the layer of GaN 107 may be a channel area of the III-V transistor 110.

In embodiments, the resistive gate contact 135 may be above the channel stack 111, for example, above the polarization layer 112 of the channel stack 111, to control the conductivity of the channel stack 111. A gate dielectric layer 136 may be below the resistive gate contact 135 and above the polarization layer 112 of the channel stack 111 to provide insulation between the channel stack 111 and the resistive gate contact 135. The resistive gate contact 135 and the gate dielectric layer 136 together may be a gate stack above the channel stack 111. The resistive gate contact 135 may include Si or Ge. For example, the resistive gate contact 135 may include one or more of polysilicon, SiGe, poly-SiGe, or $SiO_2$, and may be a polysilicon with doped impurity. Different from a normal metal gate contact, the resistive gate contact 135 may have a high resistance value, and may function as a resistor coupled to a gate of the III-V transistor 110. For example, a large voltage, e.g., 18 volt, may across the resistive gate contact 135 without breaking down the III-V transistor 110.

In embodiments, the III-V transistor 110 may further include an n-type doped source area 121 above the channel base 107 and adjacent to a first sidewall of the channel stack 111, and an n-type doped drain area 123 above the channel base 107 and adjacent to a second sidewall of the channel stack 111. A source contact 131 may be above the n-type doped source area 121 and in contact with the n-type doped source area 121. A drain contact 133 may be above the n-type doped drain area 123 and in contact with the n-type doped drain area 123. A first spacer 137 may be around the resistive gate contact 135 and the gate dielectric layer 136 to separate the n-type doped source area 121 and the source contact 131 from the resistive gate contact 135. A second spacer 139 may be around the resistive gate contact 135 and the gate dielectric layer 136 to separate the n-type doped drain area 123 and the drain contact 133 from the resistive gate contact 135.

In embodiments, the channel area, e.g., the channel stack 111 and the layer of GaN 107, the source area 121, or the drain area 123, of the III-V transistor 100 or portions thereof may comprise group II-VI, III-V, or IV materials and/or combinations thereof. In addition, the source area, the drain area, or the channel area of the III-V transistor 100 or portions thereof may comprise nitrogen, indium, germanium, indium antimonide, lead telluride, indium arsenide, indium phosphide, gallium arsenide, or gallium antimonide or combinations thereof.

In embodiments, the substrate 101 may be a silicon substrate, a glass substrate, such as soda lime glass or borosilicate glass, a metal substrate, a plastic substrate, or other suitable substrate. The substrate 101 may include silicon, sapphire, SiC, GaN, or AlN.

In embodiments, the source contact 131 or the drain contact 133 may be formed as a single layer or a stacked layer using one or more conductive films including a conductive material. For example, the source contact 131 or the drain contact 133 may include a metallic material, a conductive polymer, a polysilicon, a titanium silicide, a boron doped SiGe, or an alloy of a semiconductor material and a metal. For example, the source contact 131 or the drain contact 133 may include gold (Au), platinum (Pt), ruthenium (Ru), iridium (Ir), titanium (Ti), aluminum (Al), molybdenum (Mo), copper (Cu), tantalum (Ta), tungsten (W), nickel (Ni), chromium (Cr), hafnium (Hf), indium (In), or an alloy of Ti, Mo, Au, Pt, Al Ni, Cu, Cr, TiAlN, HfAlN, or InAlO. The source contact 131 or the drain contact 133 may include tantalum nitride (TaN), titanium nitride (TiN), iridium-tantalum alloy (Ir–Ta), indium-tin oxide (ITO), the like, and/or a combination thereof.

In embodiments, the gate dielectric layer 136 may include silicon and oxygen, silicon and nitrogen, yttrium and oxygen, silicon, oxygen, and nitrogen, aluminum and oxygen, hafnium and oxygen, tantalum and oxygen, or titanium and oxygen. For example, the gate dielectric layer 136 may include silicon oxide ($SiO_2$), silicon nitride ($SiN_x$), yttrium oxide ($Y_2O_3$), silicon oxynitride ($SiO_xN_y$), aluminum oxide ($Al_2O_3$), hafnium(IV) oxide ($HfO_2$), tantalum oxide ($Ta_2O_5$), titanium dioxide ($TiO_2$), or other materials.

Figure 2:
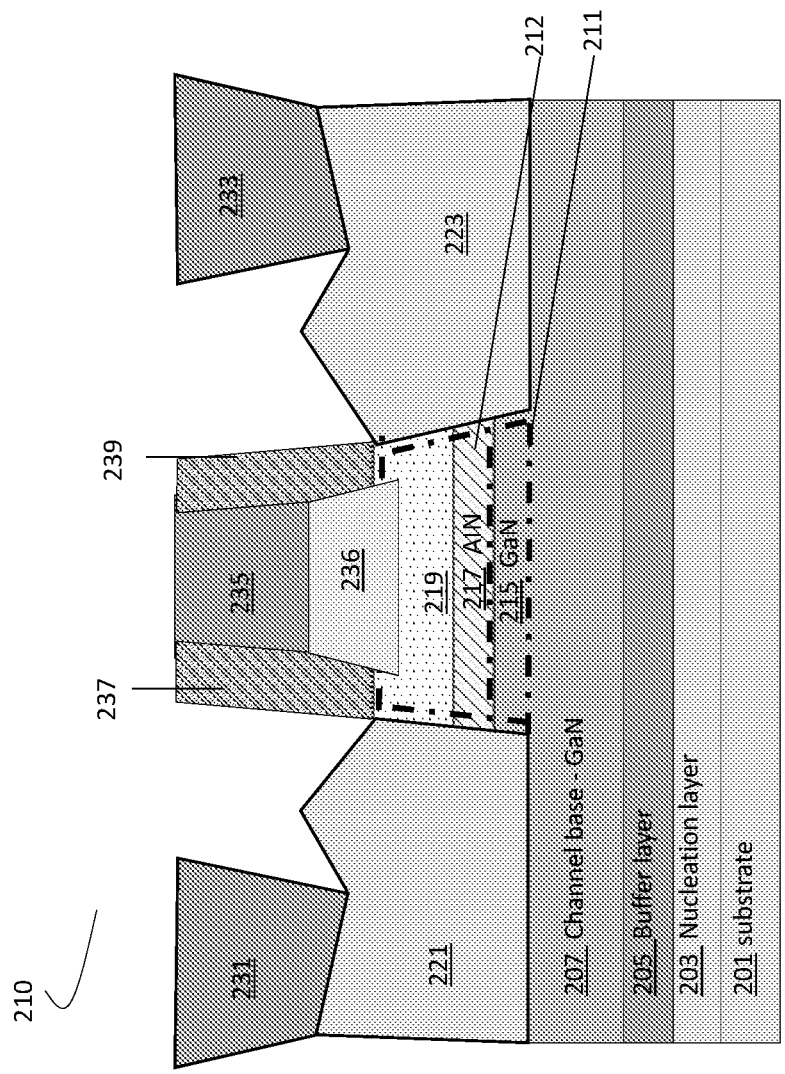
FIG. 2 schematically illustrates another example semiconductor device including an III-V transistor having a resistive gate contact, in accordance with some embodiments.

FIG. 2 schematically illustrates another example semiconductor device including an III-V transistor 210 having a resistive gate contact 235, in accordance with some embodiments. The III-V transistor 210, the resistive gate contact 235, and other components of the III-V transistor 210 may be similar to the III-V transistor 110, the resistive gate contact 135, and other corresponding components, as described in FIG. 1.

In embodiments, the III-V transistor 210 may include a substrate 201, a buffer layer 203, and a nucleation layer 205 above the substrate 201. A layer of GaN 207 may include GaN, and may be above the substrate 201, the buffer layer 203, and the nucleation layer 205.

In embodiments, the III-V transistor 210 may include a channel stack 211 above the layer of GaN 207. The channel stack 211 may include a layer of GaN 215 in the channel stack 211 and a polarization layer 212 above the layer of GaN 215 in the channel stack 211. The polarization layer 212 may include a layer of AlInGaN 219 and a layer of AlN 217.

In embodiments, the resistive gate contact 235 may be above the channel stack 211, for example, above the polarization layer 212 of the channel stack 211, to control the conductivity of the channel stack 211. A gate dielectric layer 236 may be below the resistive gate contact 235, and above the polarization layer 212 of the channel stack 211 to provide insulation between the channel stack 211 and the resistive gate contact 235. The resistive gate contact 235 and the gate dielectric layer 236 together may be a gate stack above the channel stack 211. In some embodiments, the gate dielectric layer 236 may extend into the polarization layer 212, e.g., into the layer of AlInGaN 219.

In embodiments, the III-V transistor 210 may further include an n-type doped source area 221 above the channel base 207 and adjacent to a first sidewall of the channel stack 211, and an n-type doped drain area 223 above the channel base 207 and adjacent to a second sidewall of the channel stack 211. A source contact 231 may be above the n-type doped source area 221 and in contact with the n-type doped source area 221. A drain contact 233 may be above the n-type doped drain area 223 and in contact with the n-type doped drain area 223. A first spacer 237 may be around the resistive gate contact 235 and the gate dielectric layer 236 to separate the n-type doped source area 221 and the source contact 231 from the resistive gate contact 235. A second spacer 239 may be around the resistive gate contact 235 and the gate dielectric layer 236 to separate the n-type doped drain area 223 and the drain contact 233 from the resistive gate contact 235.

Figure 3:
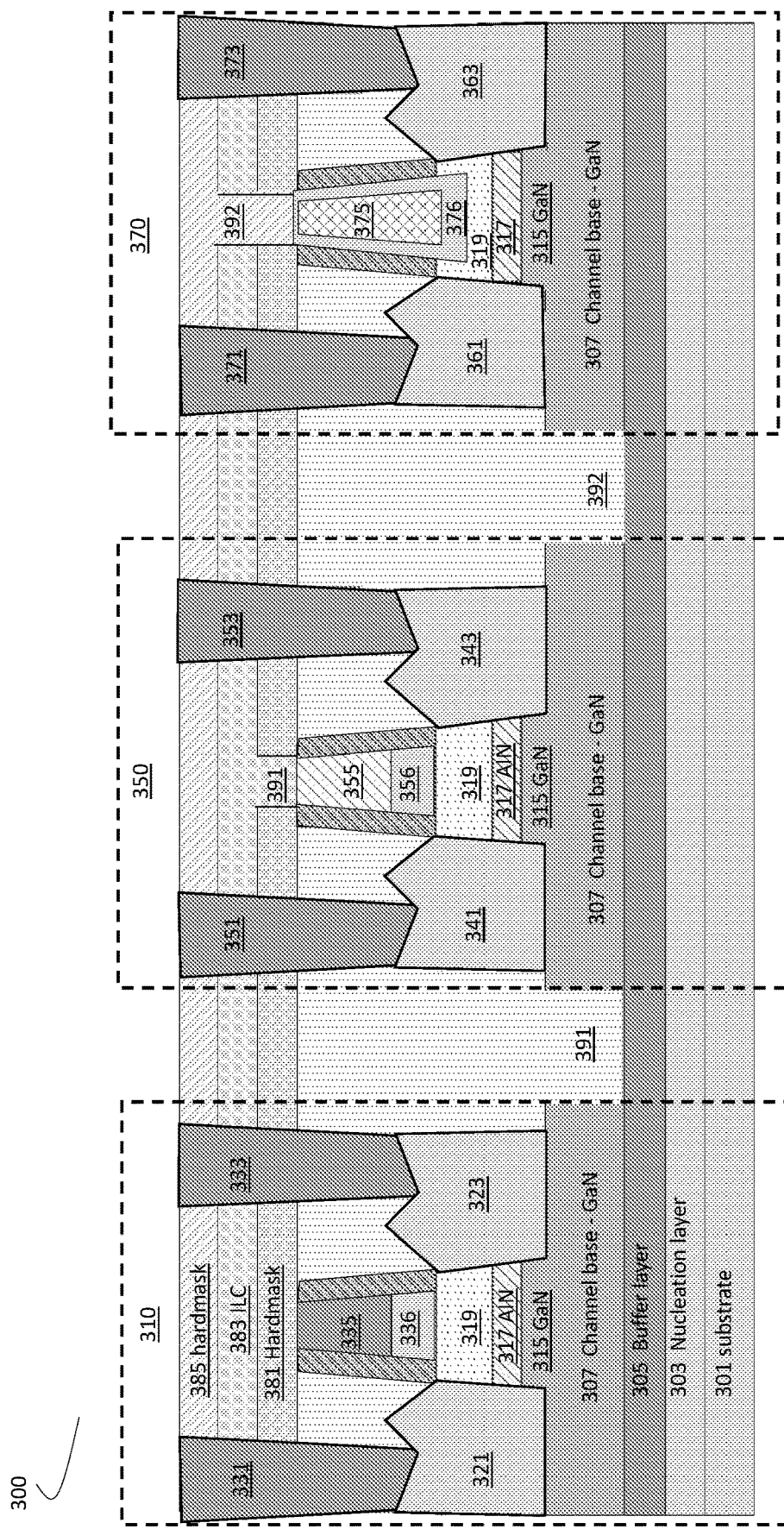
FIG. 3 schematically illustrates an example semiconductor device including multiple III-V transistors having a resistive gate contact or a metal gate contact, in accordance with some embodiments.

FIG. 3 schematically illustrates an example semiconductor device 300 including multiple III-V transistors, e.g., an III-V transistor 310, an III-V transistor 350, and an III-V transistor 370, having a resistive gate contact, e.g., a resistive gate contact 335, or a metal gate contact, e.g., a metal gate contact 355, or a metal gate contact 375, in accordance with some embodiments. The III-V transistor 310, the resistive gate contact 335, and other components of the III-V transistor 310 may be similar to the III-V transistor 110, the resistive gate contact 135, and other corresponding components, as described in FIG. 1.

In embodiments, the semiconductor device 300 may include a substrate 301, a buffer layer 303, and a nucleation layer 305 above the substrate 301. A layer of GaN 307 may include GaN, and may be above the substrate 301, the buffer layer 303, and the nucleation layer 305. The III-V transistor 310, the III-V transistor 350, and the III-V transistor 370, may be formed on the layer of GaN 307, and may be separated by an isolation area 391, and an isolation area 392. In addition, there may be a hardmask layer 381, an ILD layer 383, and a hardmask layer 385 above the III-V transistor 310, the III-V transistor 350, and the III-V transistor 370. The III-V transistor 310, the III-V transistor 350, and the III-V transistor 370 having a resistive gate contact or a metal gate contact may be integrated together on the same layer of GaN 307 to provide RF applications and analog applications, reducing the area for the system with improved speed.

In embodiments, the III-V transistor 310, the III-V transistor 350, and the III-V transistor 370, may include a channel stack above the layer of GaN 307, which includes a layer of GaN 315, a layer of AlInGaN 319 and a layer of AlN 317, where the layer of AlInGaN 319 and the layer of AlN 317 may both be in a polarization layer.

In embodiments, the III-V transistor 310 may include a resistive gate contact 335 above the polarization layer, e.g., the layer of AlInGaN 319. A gate dielectric layer 336 may be below the resistive gate contact 335, and above the polarization layer, e.g., the layer of AlInGaN 319, to provide insulation between the channel stack and the resistive gate contact 335.

In embodiments, the III-V transistor 350 may include a metal gate contact 355 above the polarization layer, e.g., the layer of AlInGaN 319. A gate dielectric layer 356 may be below the metal gate contact 355, and above the polarization layer, e.g., the layer of AlInGaN 319, to provide insulation between the channel stack and the metal gate contact 355. In embodiments, the gate dielectric layer 356 may be a thick oxide gate dielectric layer, and may include SiO2, SiN, SiON, or $Al_2O_3$.

In embodiments, the III-V transistor 370 may include a metal gate contact 375 above the polarization layer, e.g., the layer of AlInGaN 319. A gate dielectric layer 376 may be around the metal gate contact 375, and above the polarization layer, e.g., the layer of AlInGaN 319, to provide insulation between the channel stack and the resistive gate contact 375. In embodiments, the gate dielectric layer 376 may be a thin oxide gate dielectric layer, and may include $HfO_2$, $Al_2O_3$, or SiON.

In embodiments, the III-V transistor 310 may further include an n-type doped source area 321 above the channel base 307, and an n-type doped drain area 323 above the channel base 207. A source contact 331 may be above the n-type doped source area 321 and in contact with the n-type doped source area 321. A drain contact 333 may be above the n-type doped drain area 323 and in contact with the n-type doped drain area 323.

In embodiments, the III-V transistor 350 may further include an n-type doped source area 341 above the channel base 307, and an n-type doped drain area 343 above the channel base 307. A source contact 351 may be above the n-type doped source area 341 and in contact with the n-type doped source area 341. A drain contact 353 may be above the n-type doped drain area 343 and in contact with the n-type doped drain area 343.

In embodiments, the III-V transistor 370 may further include an n-type doped source area 361 above the channel base 307, and an n-type doped drain area 363 above the channel base 307. A source contact 371 may be above the n-type doped source area 361 and in contact with the n-type doped source area 361. A drain contact 373 may be above the n-type doped drain area 363 and in contact with the n-type doped drain area 363.

Figure 4A:
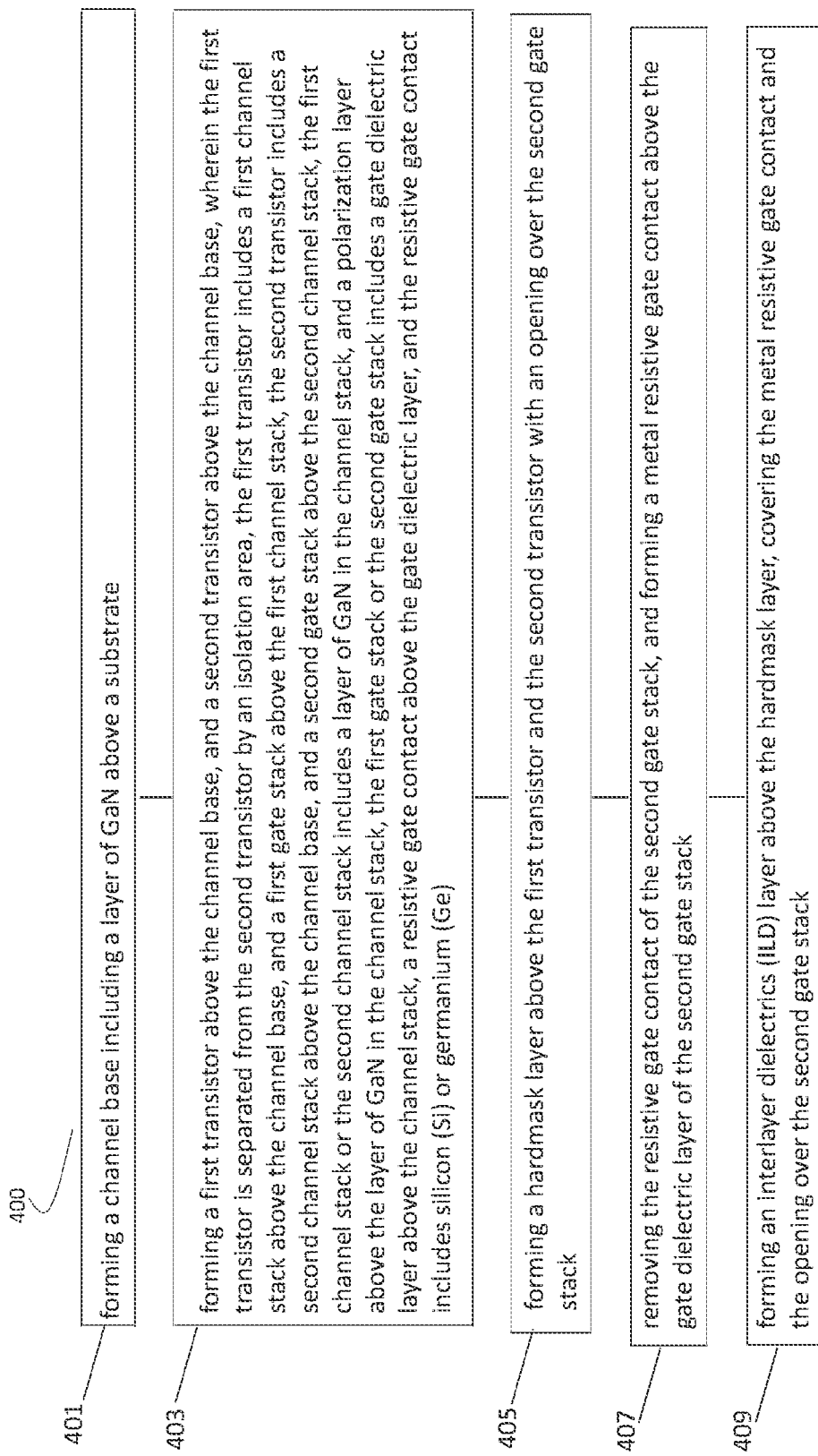

FIGS. 4A-4B illustrate a process 400 for forming a semiconductor device including multiple III-V transistors having a resistive gate contact or a metal gate contact, in accordance with some embodiments. Similarly, FIGS. 5-11 illustrate various steps of a process for forming a semiconductor device including multiple III-V transistors having a resistive gate contact or a metal gate contact, in accordance with some embodiments. In embodiments, the process 400 may be used to form a semiconductor device including multiple III-V transistors having a resistive gate contact or a metal gate contact, similar to the semiconductor device 300 in FIG. 3. FIGS. 5-11 may illustrate more details of the process 400 shown in FIGS. 4A-4B.

Figure 5:
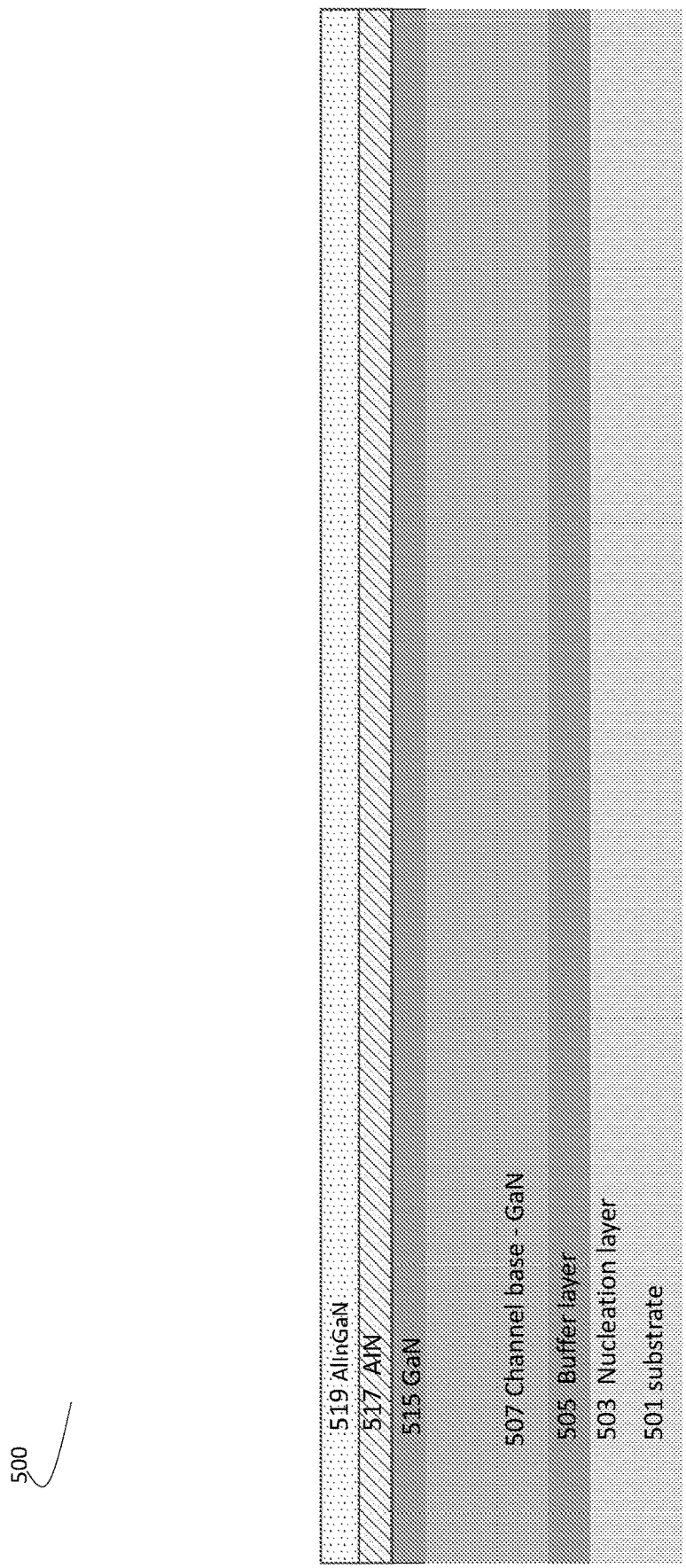
FIGS. 5-11 illustrate various steps of a process for forming a semiconductor device including multiple III-V transistors having a resistive gate contact or a metal gate contact, in accordance with some embodiments.

At block 401, the process 400 may include forming a channel base including a layer of GaN above a substrate. For example, as shown in FIG. 5, the process 400 may include forming a channel base including a layer of GaN 507 above a substrate 501. In addition, the process 400 may also including forming a buffer layer 503, and a nucleation layer 505 above the substrate 501, and below the layer of GaN 507. Furthermore, the process 400 may also including forming an additional GaN layer 515 above the layer of GaN 507, a polarization layer that may include a layer of AlN 517 and a layer of AlInGaN 519.

At block 403, the process 400 may include forming a first transistor above the channel base, and a second transistor above the channel base, wherein the first transistor is separated from the second transistor by an isolation area. The first transistor may include a first channel stack above the channel base, and a first gate stack above the first channel stack. The second transistor may include a second channel stack above the channel base, and a second gate stack above the second channel stack. The first channel stack or the second channel stack may include a layer of GaN in the channel stack, and a polarization layer above the layer of GaN in the channel stack. The first gate stack or the second gate stack may include a gate dielectric layer above the channel stack, and a resistive gate contact above the gate dielectric layer. The resistive gate contact may include Si or Ge.

Figure 6:
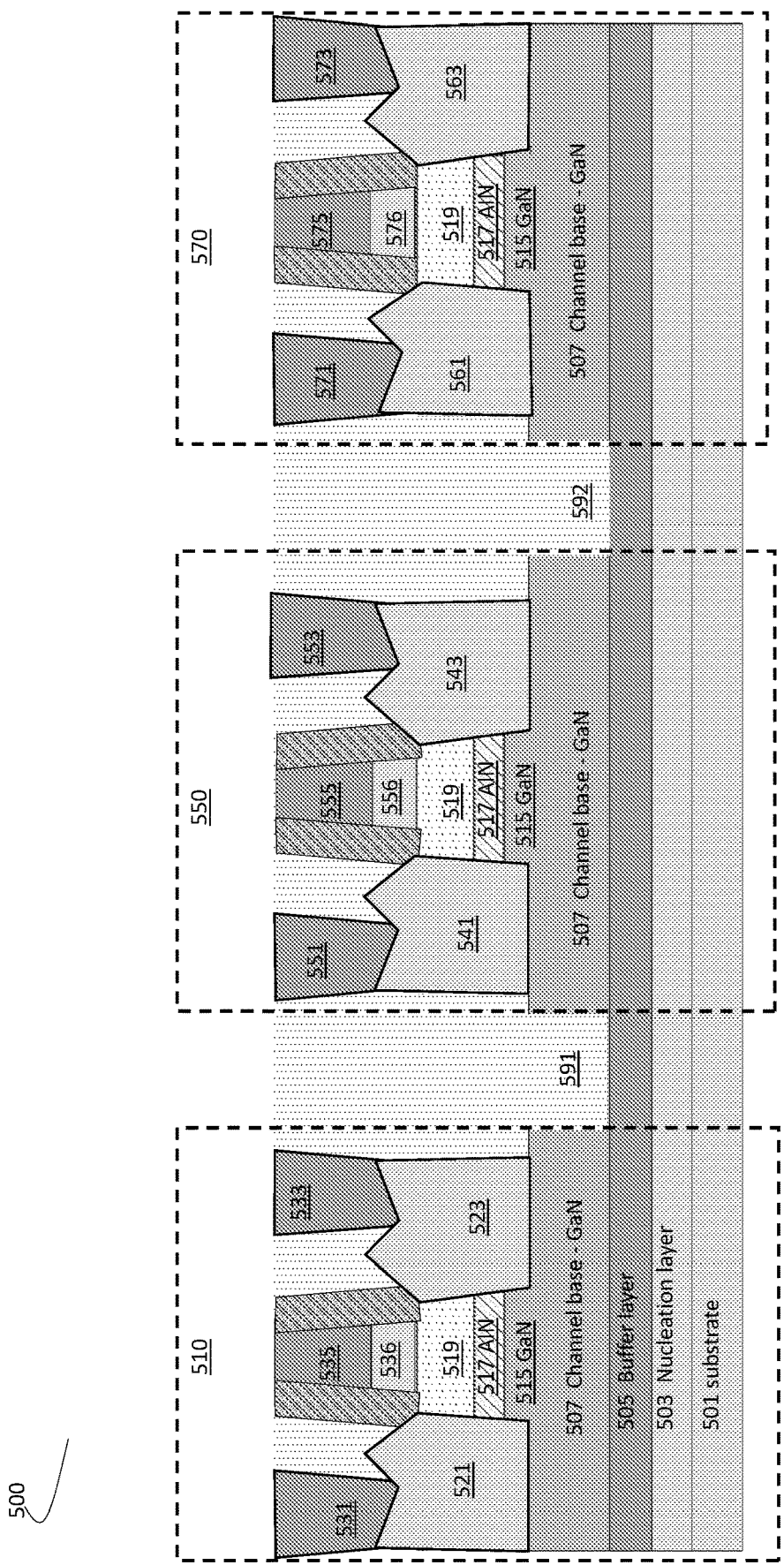

For example, as shown in FIG. 6, the process 400 may include forming a first transistor 510 above the channel base, e.g., the layer of GaN 507, a transistor 550, and a transistor 570 above the channel base, wherein the first transistor 510 is separated from the transistor 550 by an isolation area 591, and further from the transistor 570 by an isolation area 592. Either the transistor 550 or the transistor 570 may be viewed as the second transistor illustrated at the block 403. The first transistor 510 may include a first channel stack above the channel base, and a first gate stack above the first channel stack. The first channel stack may include the layer of GaN 515 in the channel stack, a 2DEG layer, not shown, and a polarization layer including the layer of AlN 517 and the layer of AlInGaN 519 above the layer of GaN 515 in the channel stack and the 2DEG layer. The first gate stack may include a gate dielectric layer 536 above the channel stack, and a resistive gate contact 535 above the gate dielectric layer 536. The resistive gate contact 535 may include Si or Ge.

The transistor 550 or the transistor 570 may include a channel stack above the channel base with same layers and materials as the first channel stack for the first transistor 510, and a same gate stack above the channel stack as the first gate stack for the first transistor 510. In detail, the transistor 550 may include a gate dielectric layer 556 above the channel stack, and a resistive gate contact 555 above the gate dielectric layer. The transistor 570 may include a gate dielectric layer 576 above the channel stack, and a resistive gate contact 575 above the gate dielectric layer.

Furthermore, the transistor 510 may include an n-type doped source area 521 and an n-type doped drain area 523 above the channel base 507. A source contact 531 may be above the n-type doped source area 521 and in contact with the n-type doped source area 521. A drain contact 533 may be above the n-type doped drain area 523 and in contact with the n-type doped drain area 523. The transistor 550 may include an n-type doped source area 541 and an n-type doped drain area 543 above the channel base 507. A source contact 551 may be above the n-type doped source area 541 and in contact with the n-type doped source area 541. A drain contact 553 may be above the n-type doped drain area 543 and in contact with the n-type doped drain area 543. The transistor 570 may include an n-type doped source area 561 and an n-type doped drain area 563 above the channel base 507. A source contact 571 may be above the n-type doped source area 561 and in contact with the n-type doped source area 561. A drain contact 573 may be above the n-type doped drain area 563 and in contact with the n-type doped drain area 563.

Figure 7:
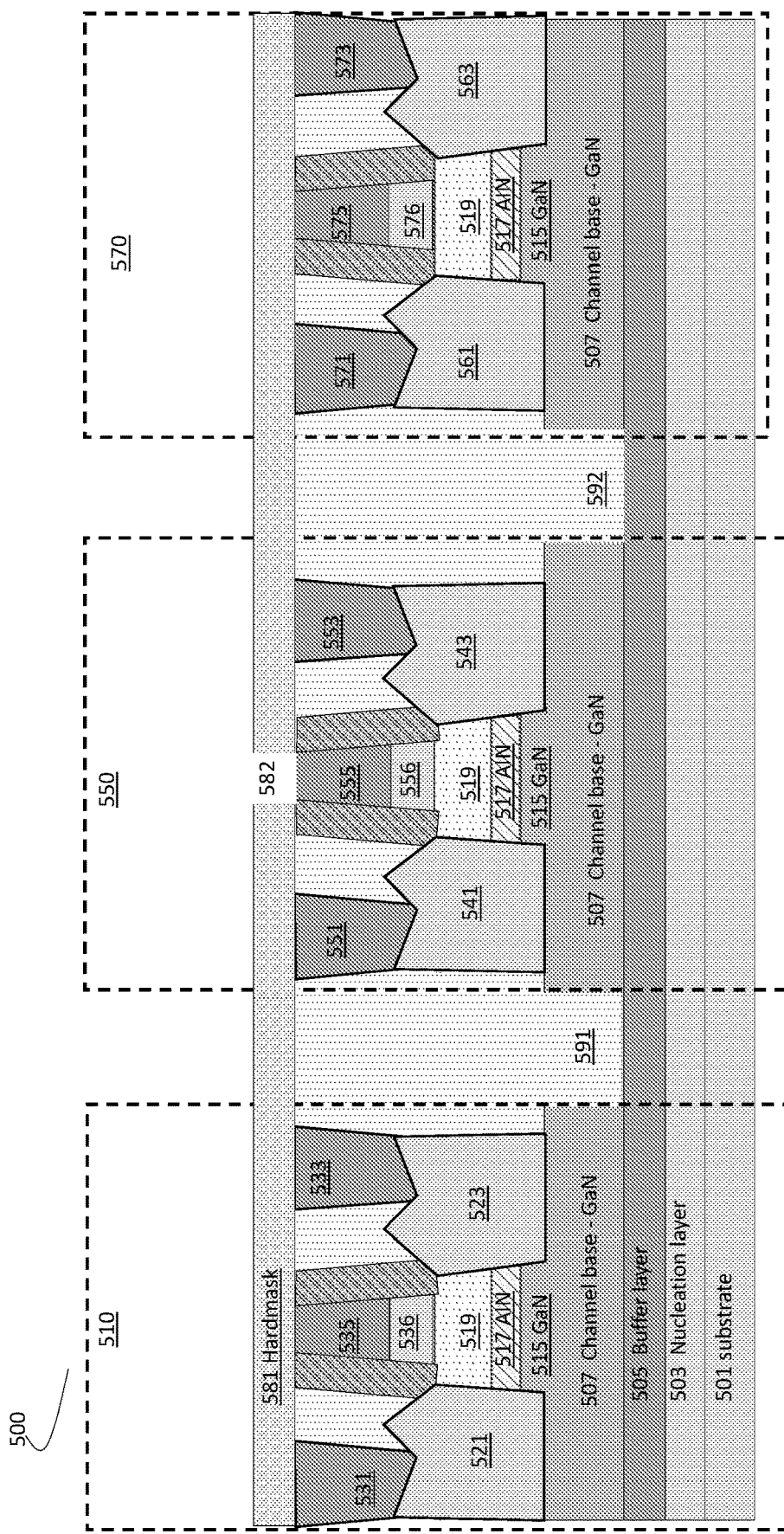
Figure 9:
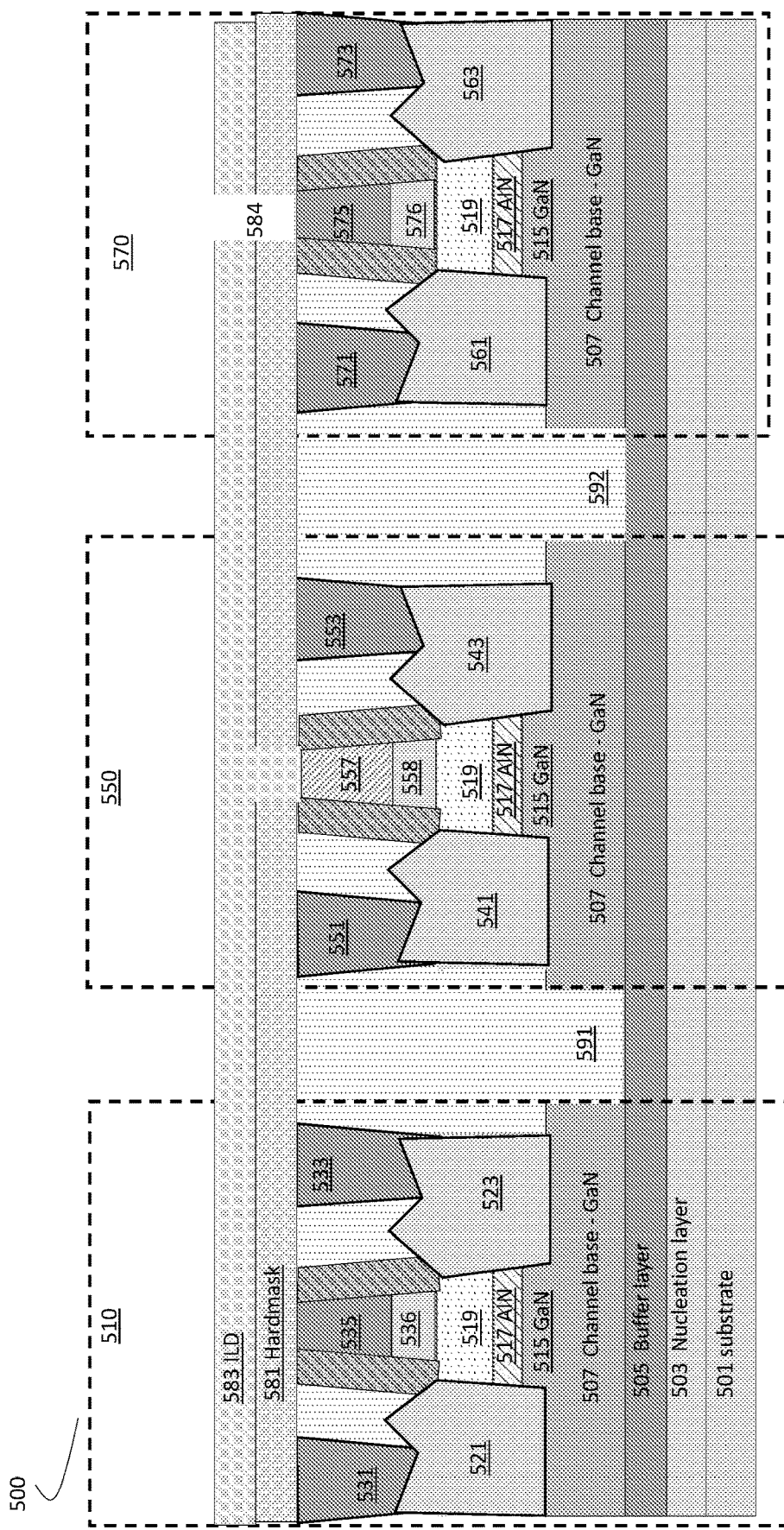

At block 405, the process 400 may include forming a hardmask layer above the first transistor and the second transistor with an opening over the second gate stack. For example, as shown in FIG. 7, the process 400 may include forming a hardmask layer 581 above the first transistor 510, the transistor 550, and the transistor 570. An opening 582 of the hardmask layer 581 may be formed over the gate stack including the gate 555. Additionally and alternatively, an opening of the hardmask layer 581 may be formed over the gate stack including the gate 575, as shown in FIG. 9.

Figure 8:
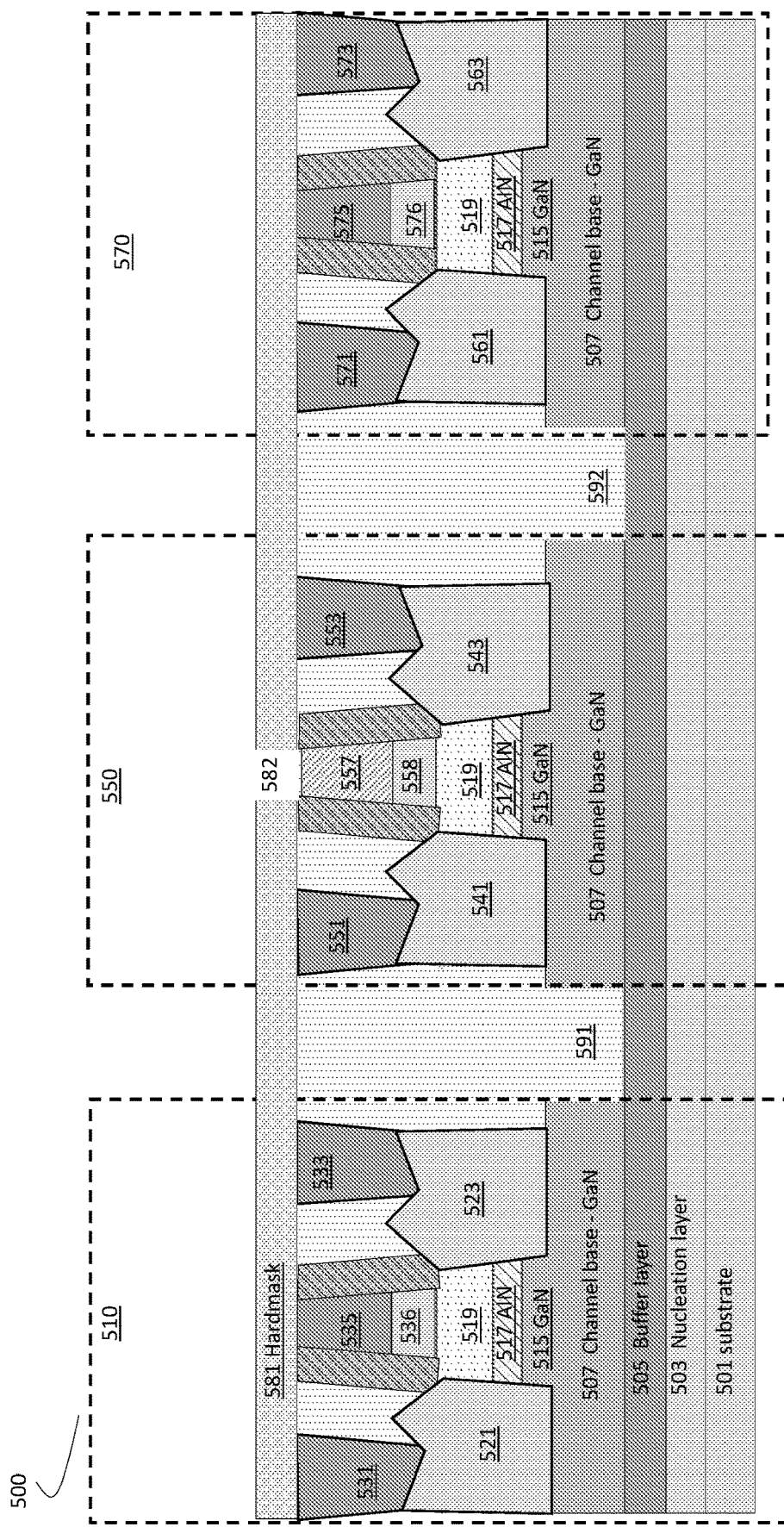

At block 407, the process 400 may include removing the resistive gate contact of the second gate stack, and forming a metal gate contact above the gate dielectric layer of the second gate stack. Additionally and alternatively, at block 411, the process 400 may include removing the gate dielectric layer of the second gate stack, and forming a thick oxide gate dielectric layer above the polarization layer of the second channel stack before forming the metal gate contact above the thick oxide gate dielectric layer. For example, as shown in FIG. 8, the process 400 may include removing the resistive gate contact 555 of the gate stack for the transistor 550, and forming a metal gate contact 557 above the gate dielectric layer 556 of the gate stack for the transistor 550. Additionally and alternatively, the process 400 may also include removing the gate dielectric layer 556 of the gate stack, and forming a thick oxide gate dielectric layer 558 above the polarization layer, e.g., the layer of AlInGaN 519, of the channel stack for the transistor 550 before forming the metal gate contact 557 above the thick oxide gate dielectric layer 558.

At block 409, the process 400 may include forming an ILD layer above the hardmask layer, covering the metal gate contact and the opening over the second gate stack. For example, as shown in FIG. 9, the process 400 may include forming an ILD layer 583 above the hardmask layer 581, covering the metal gate contact 557 and the opening 582 over the gate stack for the transistor 550.

Figure 10:
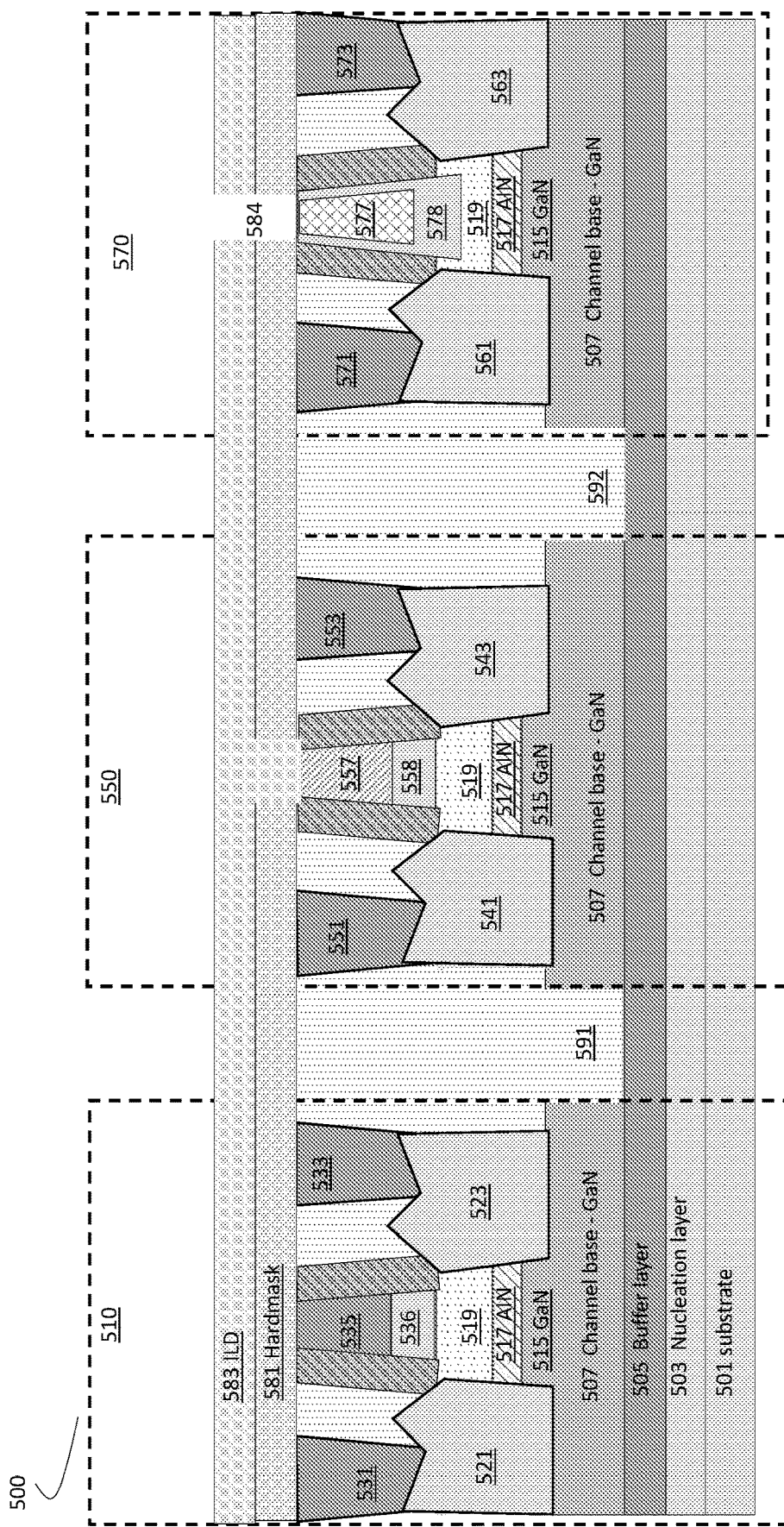

Additionally and alternatively, at block 413, the process 400 may include removing the gate dielectric layer of the second gate stack, thinning the polarization layer of the second channel stack, and forming a thin oxide gate dielectric layer above the polarization layer of the second channel stack before forming the metal gate contact above the thin oxide gate dielectric layer. For example, as shown in FIG. 10, the process 400 may include removing the gate dielectric layer 576 of the gate stack of the transistor 570, thinning the polarization layer 519 of the second channel stack, and forming a thin oxide gate dielectric layer 578 above the polarization layer, e.g., the layer of AlInGaN 519, before forming a metal gate contact 577 above the thin oxide gate dielectric layer 578. In addition, the process 400 may include forming a metal gate contact 577 surrounded by the thin oxide gate dielectric layer 578. An opening 584 may be formed within the ILD layer 583 and the hardmask layer 581, so that the original resistive gate contact 575 may be replaced by the metal gate contact 577.

Figure 11:
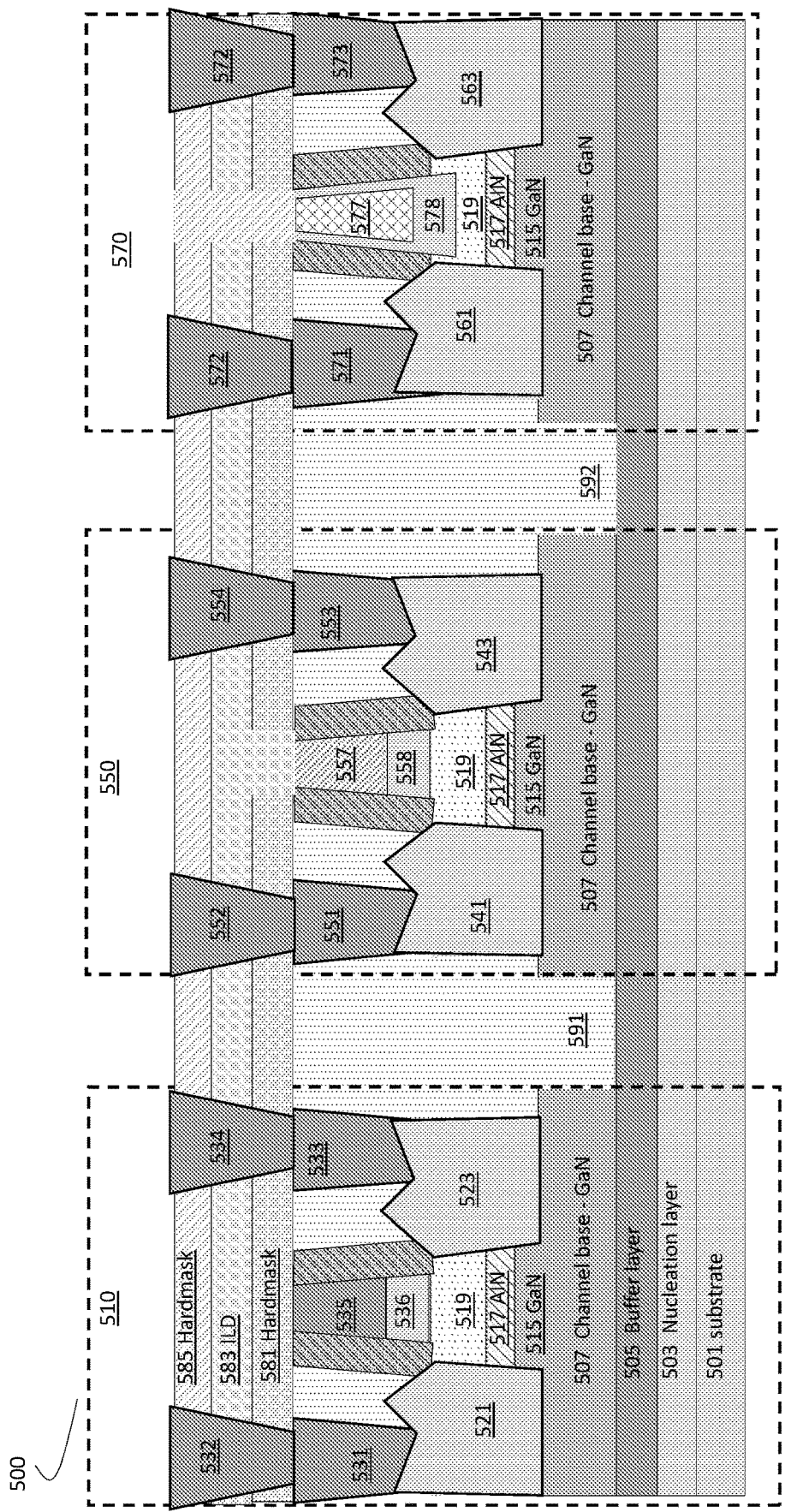

At block 415, the process 400 may include forming contact vias through the hardmask layer and the ILD layer to be coupled with source contacts and drain contacts of the first transistor and the second transistor. For example, as shown in FIG. 11, a hardmask layer 585 may be formed covering the ILD layer 583, and the opening 584. The process 400 may include forming a contact via 532, a contact via 534, a contact via 552, a contact via 554, a contact via 572, and a contact via 574, through the hardmask layer 585, the ILD layer 583, and the hardmask layer 581 to be coupled with source contacts and drain contacts of the transistor 510, the transistor 550, and the transistor 570.

Figure 12:
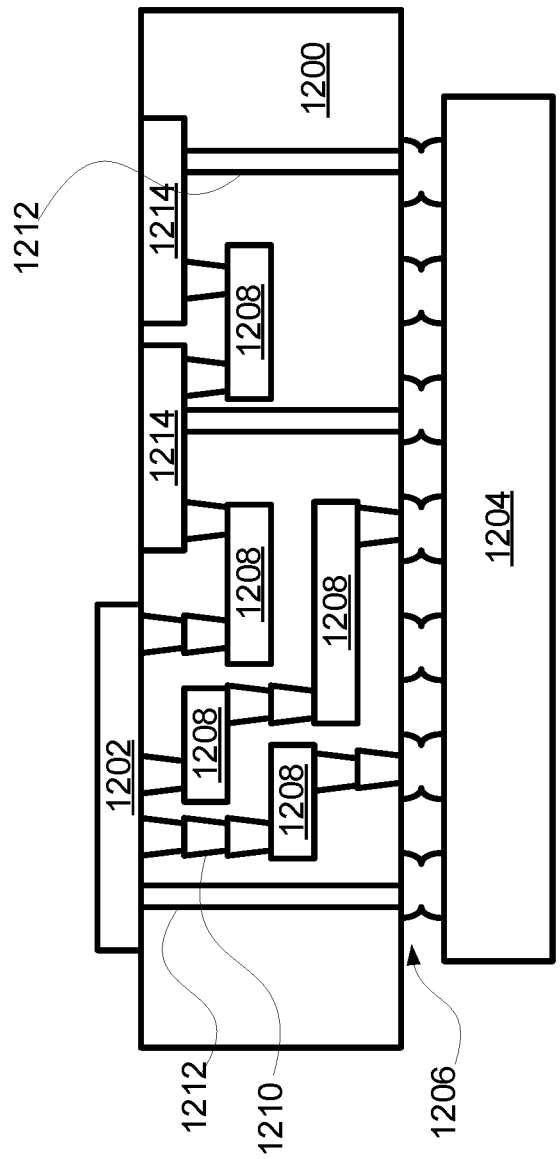
FIG. 12 schematically illustrates an interposer implementing one or more embodiments of the disclosure, in accordance with some embodiments.

FIG. 12 illustrates an interposer 1200 that includes one or more embodiments of the disclosure. The interposer 1200 is an intervening substrate used to bridge a first substrate 1202 to a second substrate 1204. The first substrate 1202 may be, for instance, a substrate support for an III-V transistor, a passive element, and a resonator, e.g., the III-V transistor 110 including the resistive gate contact 135, shown in FIG. 1. The second substrate 1204 may be, for instance, a memory module, a computer motherboard, or another integrated circuit die. Generally, the purpose of an interposer 1200 is to spread a connection to a wider pitch or to reroute a connection to a different connection. For example, an interposer 1200 may couple an integrated circuit die to a ball grid array (BGA) 1206 that can subsequently be coupled to the second substrate 1204. In some embodiments, the first and second substrates 1202/1204 are attached to opposing sides of the interposer 1200. In other embodiments, the first and second substrates 1202/1204 are attached to the same side of the interposer 1200. And in further embodiments, three or more substrates are interconnected by way of the interposer 1200.

The interposer 1200 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1208 and vias 1210, including but not limited to through-silicon vias (TSVs) 1212. The interposer 1200 may further include embedded devices 1214, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1200.

In accordance with embodiments of the disclosure, apparatuses or processes disclosed herein may be used in the fabrication of interposer 1200.

Figure 13:
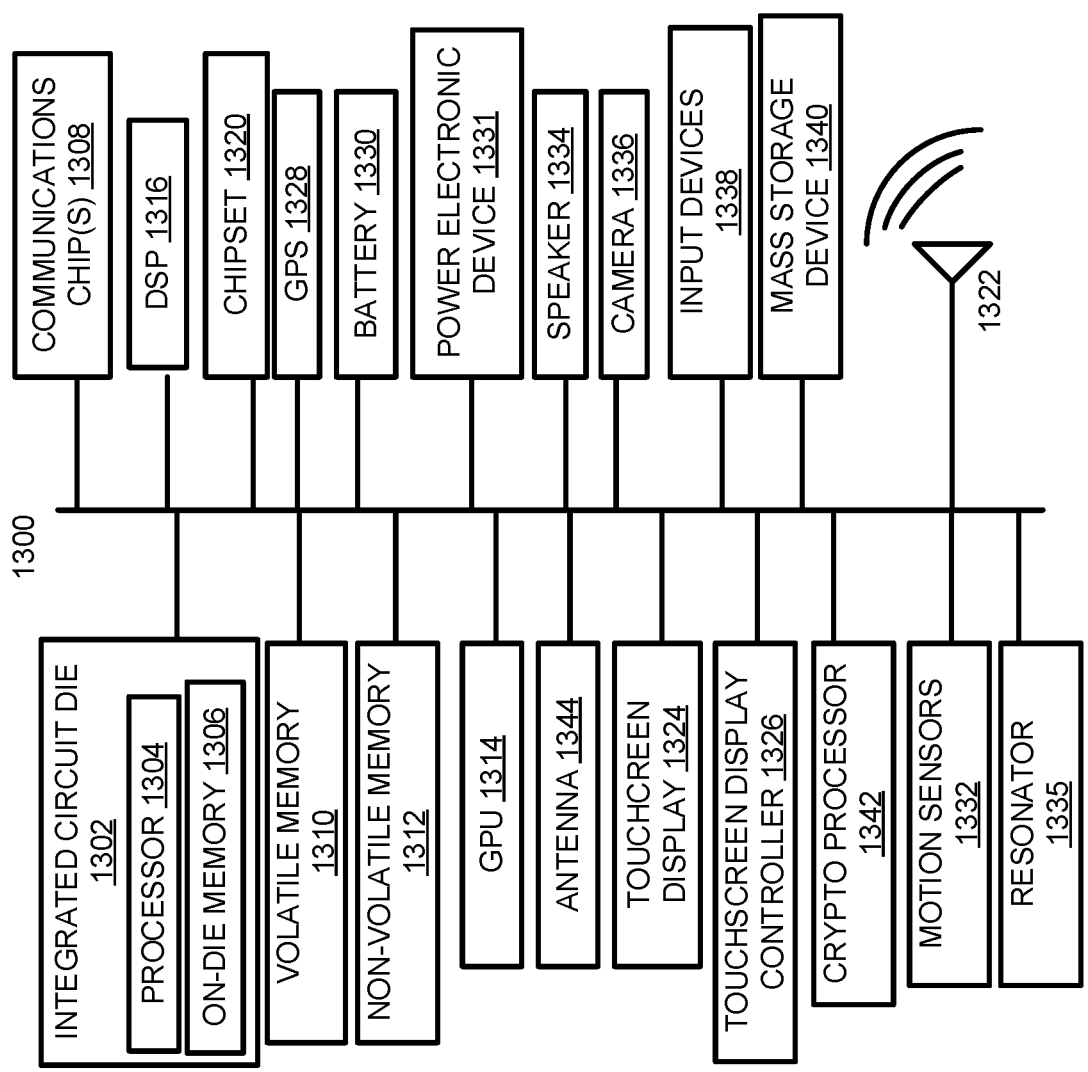
FIG. 13 schematically illustrates a computing device built in accordance with an embodiment of the disclosure, in accordance with some embodiments.

FIG. 13 illustrates a computing device 1300 in accordance with one embodiment of the disclosure. The computing device 1300 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 1300 include, but are not limited to, an integrated circuit die 1302 and at least one communications logic unit 1308. In some implementations the communications logic unit 1308 is fabricated within the integrated circuit die 1302 while in other implementations the communications logic unit 1308 is fabricated in a separate integrated circuit chip that may be bonded to a substrate or motherboard that is shared with or electronically coupled to the integrated circuit die 1302. The integrated circuit die 1302 may include a processor 1304 as well as on-die memory 1306, often used as cache memory, which can be provided by technologies such as embedded DRAM (eDRAM), or SRAM. For example, the processor 1304 or the on-die memory 1306, or other control circuits in the integrated circuit die 1302 may include an III-V transistor, e.g., the III-V transistor 110 as shown in FIG. 1, or the transistor 310, the transistor 350, and the transistor 370, as shown in FIG. 3, or the transistor 510, the transistor 550, and the transistor 570, formed following the process 400 as shown in FIG. 11.

In embodiments, the computing device 1300 may include a display or a touchscreen display 1324, and a touchscreen display controller 1326. A display or the touchscreen display 1324 may include a FPD, an AMOLED display, a TFT LCD, a micro light-emitting diode (μLED) display, or others.

Computing device 1300 may include other components that may or may not be physically and electrically coupled to the motherboard or fabricated within a SoC die. These other components include, but are not limited to, volatile memory 1310 (e.g., dynamic random access memory (DRAM), non-volatile memory 1312 (e.g., ROM or flash memory), a graphics processing unit 1314 (GPU), a digital signal processor (DSP) 1316, a crypto processor 1342 (e.g., a specialized processor that executes cryptographic algorithms within hardware), a chipset 1320, at least one antenna 1322 (in some implementations two or more antenna may be used), a battery 1330 or other power source, a power electronic device 1331, a voltage regulator (not shown), a global positioning system (GPS) device 1328, a compass, a motion coprocessor or sensors 1332 (that may include an accelerometer, a gyroscope, and a compass), a microphone (not shown), a speaker 1334, a resonator 1335, a camera 1336, user input devices 1338 (such as a keyboard, mouse, stylus, and touchpad), and a mass storage device 1340 (such as hard disk drive, compact disk (CD), digital versatile disk (DVD), and so forth). In embodiments, the power electronic device 1331 may include an III-V transistor, e.g., the III-V transistor 110 as shown in FIG. 1, or the transistor 310, the transistor 350, and the transistor 370, as shown in FIG. 3, or the transistor 510, the transistor 550, and the transistor 570, formed following the process 400 as shown in FIG. 11.

The computing device 1300 may incorporate further transmission, telecommunication, or radio functionality not already described herein. In some implementations, the computing device 1300 includes a radio that is used to communicate over a distance by modulating and radiating electromagnetic waves in air or space. In further implementations, the computing device 1300 includes a transmitter and a receiver (or a transceiver) that is used to communicate over a distance by modulating and radiating electromagnetic waves in air or space.

The communications logic unit 1308 enables wireless communications for the transfer of data to and from the computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 1308 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 1300 may include a plurality of communications logic units 1308. For instance, a first communications logic unit 1308 may be dedicated to shorter range wireless communications such as Wi-Fi, NFC, and Bluetooth and a second communications logic unit 1308 may be dedicated to longer range wireless communications such as GPS, EDGE, GPRS, CDMA, WiMAX, LTE, Ev-DO, and others.

The processor 1304 of the computing device 1300 includes one or more devices, such as transistors. The term "processor" may refer to any device or portion of a device that processes electronic data from registers and/or memory to transform that electronic data into other electronic data that may be stored in registers and/or memory. The communications logic unit 1308 may also include one or more devices, such as transistors.

In further embodiments, another component housed within the computing device 1300 may contain one or more devices, such as the power electronic device 1331, that are formed in accordance with implementations of the current disclosure, e.g., the III-V transistor 110 as shown in FIG. 1, or the transistor 310, the transistor 350, and the transistor 370, as shown in FIG. 3, or the transistor 510, the transistor 550, and the transistor 570, formed following the process 400 as shown in FIG. 11.

In various embodiments, the computing device 1300 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1300 may be any other electronic device that processes data.

Some non-limiting Examples are provided below.

Example 1 may include a semiconductor device, comprising: a substrate; a channel base including a layer of GaN above the substrate; a channel stack above the channel base, wherein the channel stack includes a layer of GaN in the channel stack, and a polarization layer above the layer of GaN in the channel stack; and a gate stack above the channel stack, wherein the gate stack includes a gate dielectric layer above the channel stack, a resistive gate contact above the gate dielectric layer, and the resistive gate contact includes silicon (Si) or germanium (Ge).

Example 2 may include the semiconductor device of example 1 and/or some other examples herein, wherein the resistive gate contact includes one or more of polysilicon, SiGe, poly-SiGe, or $SiO_2$.

Example 3 may include the semiconductor device of any one of examples 1-2 and/or some other examples herein, wherein the resistive gate contact is a polysilicon with doped impurity.

Example 4 may include the semiconductor device of any one of examples 1-2 and/or some other examples herein, further comprising: an n-type doped source area above the channel base and adjacent to a first sidewall of the channel stack, and a n-type doped drain area above the channel base and adjacent to a second sidewall of the channel stack; a source contact above the n-type doped source area and in contact with the n-type doped source area; a drain contact above the n-type doped drain area and in contact with the n-type doped drain area; a first spacer around a first sidewall of the gate stack to separate the n-type doped source area and the source contact from the resistive gate contact; and a second spacer around a second sidewall of the gate stack to separate the n-type doped drain area and the drain contact from the resistive gate contact.

Example 5 may include the semiconductor device of any one of examples 1-2 and/or some other examples herein, wherein the gate dielectric layer extends into the polarization layer, and the resistive gate contact is above the gate dielectric layer and above the polarization layer.

Example 6 may include the semiconductor device of any one of examples 1-2 and/or some other examples herein, further comprising: a buffer layer or a nucleation layer between the substrate and the channel base.

Example 7 may include the semiconductor device of any one of examples 1-2 and/or some other examples herein, wherein the polarization layer includes AlInGaN or AlN.

Example 8 may include the semiconductor device of example 7 and/or some other examples herein, wherein the layer of AlInGaN includes $Al_xIn_yGa_{1-x-y}N$, where x is in a range of about 70% and 95%, y is in a range of about 0% to 20%, and 1−x−y is in a range of about 0% to 30%.

Example 9 may include the semiconductor device of any one of examples 1-2 and/or some other examples herein, wherein the substrate includes silicon, sapphire, SiC, GaN, or AlN.

Example 10 may include the semiconductor device of any one of examples 1-2 and/or some other examples herein, wherein the channel stack and the gate stack are parts of a first transistor, and the semiconductor device further includes a second transistor separated from the first transistor by an isolation area, wherein the second transistor includes a metal gate contact over a thick oxide gate dielectric layer.

Example 11 may include the semiconductor device of example 10 and/or some other examples herein, wherein the thick oxide gate dielectric layer includes SiO2, SiN, SiON, or $Al_2O_3$.

Example 12 may include the semiconductor device of any one of examples 1-2 and/or some other examples herein, wherein the channel stack and the gate stack are parts of a first transistor, and the semiconductor device further includes a second transistor separated from the first transistor by an isolation area, wherein the second transistor includes a metal gate contact over a thin oxide gate dielectric layer.

Example 13 may include the semiconductor device of example 12 and/or some other examples herein, wherein the thin oxide gate dielectric layer includes $HfO_2$, $Al_2O_3$, or SiON.

Example 14 may include a method for forming a semiconductor device, the method comprising: forming a channel base including a layer of GaN above a substrate; forming a first transistor above the channel base, and a second transistor above the channel base, wherein the first transistor is separated from the second transistor by an isolation area, the first transistor includes a first channel stack above the channel base, and a first gate stack above the first channel stack, the second transistor includes a second channel stack above the channel base, and a second gate stack above the second channel stack, the first channel stack or the second channel stack includes a layer of GaN in the channel stack, and a polarization layer above the layer of GaN in the channel stack, the first gate stack or the second gate stack includes a gate dielectric layer above the channel stack, a resistive gate contact above the gate dielectric layer, and the resistive gate contact includes silicon (Si) or germanium (Ge); forming a hardmask layer above the first transistor and the second transistor with an opening over the second gate stack; removing the resistive gate contact of the second gate stack, and forming a metal gate contact above the gate dielectric layer of the second gate stack; and forming an interlayer dielectrics (ILD) layer above the hardmask layer, covering the metal gate contact and the opening over the second gate stack.

Example 15 may include the method of example 14 and/or some other examples herein, wherein the resistive gate contact includes one or more of polysilicon, SiGe, poly-SiGe, or $SiO_2$.

Example 16 may include the method of any one of examples 14-15 and/or some other examples herein, wherein the resistive gate contact is a polysilicon with doped impurity.

Example 17 may include the method of any one of examples 14-15 and/or some other examples herein, further comprising: removing the gate dielectric layer of the second gate stack, and forming a thick oxide gate dielectric layer above the polarization layer of the second channel stack before forming the metal gate contact above the thick oxide gate dielectric layer.

Example 18 may include the method of any one of examples 14-15 and/or some other examples herein, further comprising: removing the gate dielectric layer of the second gate stack; thinning the polarization layer of the second channel stack; and forming a thin oxide gate dielectric layer above the polarization layer of the second channel stack before forming the metal gate contact above the thin oxide gate dielectric layer.

Example 19 may include the method of any one of examples 14-15 and/or some other examples herein, further comprising: forming contact vias through the hardmask layer and the ILD layer to be coupled with source contacts and drain contacts of the first transistor and the second transistor.

Example 20 may include the method of any one of examples 14-15 and/or some other examples herein, further comprising: forming a buffer layer or a nucleation layer between the substrate and the channel base.

Example 21 may include the method of any one of examples 14-15 and/or some other examples herein, wherein the polarization layer includes AlInGaN or AlN.

Example 22 may include a computing device, comprising: a control circuit; and a power electronic device coupled to the control circuit, wherein the power electronic device or the control circuit includes a transistor comprising: a substrate; a channel base including a layer of GaN above the substrate; a channel stack above the channel base, wherein the channel stack includes a layer of GaN in the channel stack, and a polarization layer above the layer of GaN in the channel stack; and a gate stack above the channel stack, wherein the gate stack includes a gate dielectric layer above the channel stack, a resistive gate contact above the gate dielectric layer, and the resistive gate contact includes silicon (Si) or germanium (Ge).

Example 23 may include the computing device of example 22 and/or some other examples herein, wherein the resistive gate contact includes one or more of polysilicon, SiGe, poly-SiGe, SiO$_2$, or a polysilicon with doped impurity.

Example 24 may include the computing device of any one of examples 22-23 and/or some other examples herein, wherein the polarization layer includes AlInGaN or AlN.

Example 25 may include the computing device of any one of examples 22-23 and/or some other examples herein, wherein the computing device is a wearable device or a mobile computing device, the wearable device or the mobile computing device including one or more of an antenna, a touchscreen controller, a battery, an audio codec, a video codec, a power amplifier, a global positioning system (GPS) device, a compass, a Geiger counter, an accelerometer, a gyroscope, a speaker, or a camera coupled with the processor.

Example 26 may include one or more computer-readable media having instructions for forming a semiconductor device, upon execution of the instructions by one or more processors, to perform the method of any one of examples 14-21.

Example 27 may include an apparatus for forming a semiconductor device, the apparatus comprising: means for forming a channel base including a layer of GaN above a substrate; means for forming a first transistor above the channel base, and a second transistor above the channel base, wherein the first transistor is separated from the second transistor by an isolation area, the first transistor includes a first channel stack above the channel base, and a first gate stack above the first channel stack, the second transistor includes a second channel stack above the channel base, and a second gate stack above the second channel stack, the first channel stack or the second channel stack includes a layer of GaN in the channel stack, and a polarization layer above the layer of GaN in the channel stack, the first gate stack or the second gate stack includes a gate dielectric layer above the channel stack, a resistive gate contact above the gate dielectric layer, and the resistive gate contact includes silicon (Si) or germanium (Ge); means for forming a hardmask layer above the first transistor and the second transistor with an opening over the second gate stack; means for removing the resistive gate contact of the second gate stack, and forming a metal gate contact above the gate dielectric layer of the second gate stack; and means for forming an interlayer dielectrics (ILD) layer above the hardmask layer, covering the metal gate contact and the opening over the second gate stack.

Example 28 may include the apparatus of example 27 and/or some other examples herein, wherein the resistive gate contact includes one or more of polysilicon, SiGe, poly-SiGe, or SiO$_2$.

Example 29 may include the apparatus of any one of examples 27-28 and/or some other examples herein, wherein the resistive gate contact is a polysilicon with doped impurity.

Example 30 may include the apparatus of any one of examples 27-28 and/or some other examples herein, further comprising: means for removing the gate dielectric layer of the second gate stack; and means for forming a thick oxide gate dielectric layer above the polarization layer of the second channel stack before forming the metal gate contact above the thick oxide gate dielectric layer.

Example 31 may include the apparatus of any one of examples 27-28 and/or some other examples herein, further comprising: means for removing the gate dielectric layer of the second gate stack; means for thinning the polarization layer of the second channel stack; and means for forming a thin oxide gate dielectric layer above the polarization layer of the second channel stack before forming the metal gate contact above the thin oxide gate dielectric layer.

Example 32 may include the apparatus of any one of examples 27-28 and/or some other examples herein, further comprising: means for forming contact vias through the hardmask layer and the ILD layer to be coupled with source contacts and drain contacts of the first transistor and the second transistor.

Example 33 may include the apparatus of any one of examples 27-28 and/or some other examples herein, further comprising: means for forming a buffer layer or a nucleation layer between the substrate and the channel base.

Example 34 may include the apparatus of any one of examples 27-28 and/or some other examples herein, wherein the polarization layer includes AlInGaN or AlN.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
   a substrate;
   a channel base including a layer of GaN above the substrate;
   a channel stack above the channel base, wherein the channel stack includes a layer of GaN in the channel stack, and a polarization layer above the layer of GaN in the channel stack; and a gate stack above the channel stack, wherein the gate stack includes a gate dielectric layer above the channel stack, and a resistive gate contact directly on the gate dielectric layer, wherein the resistive gate contact includes one or more of silicon (Si) or germanium (Ge), wherein the gate dielectric layer extends into the polarization layer.

2. The semiconductor device of claim 1, wherein the resistive gate contact includes one or more of polysilicon, SiGe, or poly-SiGe.

3. The semiconductor device of claim 1, wherein the resistive gate contact is a polysilicon with doped impurity.

4. The semiconductor device of claim 1, further comprising:
an n-type doped source area above the channel base and adjacent to a first sidewall of the channel stack, and an n-type doped drain area above the channel base and adjacent to a second sidewall of the channel stack;
a source contact above the n-type doped source area and in contact with the n-type doped source area;
a drain contact above the n-type doped drain area and in contact with the n-type doped drain area;
a first spacer around a first sidewall of the gate stack to separate the n-type doped source area and the source contact from the resistive gate contact; and
a second spacer around a second sidewall of the gate stack to separate the n-type doped drain area and the drain contact from the resistive gate contact.

5. The semiconductor device of claim 1, wherein the resistive gate contact is above the gate dielectric layer and above the polarization layer.

6. The semiconductor device of claim 1, further comprising:
a buffer layer or a nucleation layer between the substrate and the channel base.

7. The semiconductor device of claim 1, wherein the polarization layer includes one or more of a layer of AlInGaN or a layer of AlN.

8. The semiconductor device of claim 7, wherein the layer of AlInGaN includes $Al_xIn_yGa_{1-x-y}N$, where x may be in a range of about 70% and 95%, y is in a range of about 0% to 20%, and 1-x-y is in a range of about 0% to 30%.

9. The semiconductor device of claim 1, wherein the substrate includes silicon, sapphire, SiC, GaN, or AlN.

10. The semiconductor device of claim 1, wherein the channel stack and the gate stack are parts of a first transistor, and the semiconductor device further includes a second transistor separated from the first transistor by an isolation area, wherein the second transistor includes a metal gate contact over an oxide gate dielectric layer.

11. The semiconductor device of claim 10, wherein the oxide gate dielectric layer includes SiO2, SiN, SiON, or $Al_2O_3$.

12. The semiconductor device of claim 1, wherein the channel stack and the gate stack are parts of a first transistor, and the semiconductor device further includes a second transistor separated from the first transistor by an isolation area, wherein the second transistor includes a metal gate contact over a gate dielectric layer.

13. The semiconductor device of claim 12, wherein the gate dielectric layer includes $HfO_2$, $Al_2O_3$, or SiON.

14. A method for forming a semiconductor device, the method comprising:
forming a channel base including a layer of GaN above a substrate;
forming a first transistor above the channel base, and a second transistor above the channel base, wherein the first transistor is separated from the second transistor by an isolation area, the first transistor includes a first channel stack above the channel base, and a first gate stack above the first channel stack, the second transistor includes a second channel stack above the channel base, and a second gate stack above the second channel stack, the first channel stack or the second channel stack includes a layer of GaN in the channel stack, and a polarization layer above the layer of GaN in the channel stack, the first gate stack or the second gate stack includes a gate dielectric layer above the channel stack, a resistive gate contact above the gate dielectric layer, and the resistive gate contact includes one or more of silicon (Si) or germanium (Ge);
forming a hardmask layer above the first transistor and the second transistor with an opening over the second gate stack;
removing the resistive gate contact of the second gate stack, and forming a metal gate contact above the gate dielectric layer of the second gate stack; and
forming an interlayer dielectric (ILD) layer above the hardmask layer, covering the metal gate contact and the opening over the second gate stack.

15. The method of claim 14, wherein the resistive gate contact includes one or more of polysilicon, SiGe, or poly-SiGe.

16. The method of claim 14, wherein the resistive gate contact is a polysilicon with doped impurity.

17. The method of claim 14, further comprising:
removing the gate dielectric layer of the second gate stack, and forming an oxide gate dielectric layer above the polarization layer of the second channel stack before forming the metal gate contact above the oxide gate dielectric layer.

18. The method of claim 14, further comprising:
removing the gate dielectric layer of the second gate stack;
thinning the polarization layer of the second channel stack; and
forming an oxide gate dielectric layer above the polarization layer of the second channel stack before forming the metal gate contact above the oxide gate dielectric layer.

19. The method of claim 14, further comprising:
forming contact vias through the hardmask layer and the ILD layer to be coupled with source contacts and drain contacts of the first transistor and the second transistor.

20. The method of claim 14, further comprising:
forming a buffer layer or a nucleation layer between the substrate and the channel base.

21. The method of claim 14, wherein the polarization layer includes AlInGaN or AlN.

22. A computing device, comprising:
a control circuit; and
a power electronic device coupled to the control circuit, wherein the power electronic device or the control circuit includes a transistor comprising:
a substrate;
a channel base including a layer of GaN above the substrate;
a channel stack above the channel base, wherein the channel stack includes a layer of GaN in the channel stack, and a polarization layer above the layer of GaN in the channel stack; and
a gate stack above the channel stack, wherein the gate stack includes a gate dielectric layer above the channel stack, and a resistive gate contact directly on the gate dielectric layer, wherein the resistive gate contact includes one or more of silicon (Si) or germanium (Ge), wherein the gate dielectric layer extends into the polarization layer.

23. The computing device of claim 22, wherein the resistive gate contact includes one or more of polysilicon, SiGe, poly-SiGe, or polysilicon doped with an impurity.

24. The computing device of claim 22, wherein the polarization layer includes one or more of AlInGaN or AlN.

25. The computing device of claim 22, wherein the computing device is a wearable device or a mobile computing device, the wearable device or the mobile computing device including one or more of an antenna, a touchscreen controller, a battery, an audio codec, a video codec, a power amplifier, a global positioning system (GPS) device, a compass, a Geiger counter, an accelerometer, a gyroscope, a speaker, or a camera coupled with the processor.

26. A semiconductor device, comprising:
a substrate;
a channel base including a layer of GaN above the substrate;
a channel stack above the channel base, wherein the channel stack includes a layer of GaN in the channel stack, and a polarization layer above the layer of GaN in the channel stack wherein the polarization layer includes a layer of AlInGaN, and wherein the layer of AlInGaN includes $Al_xIn_yGa_{1-x-y}N$, where x may be in a range of about 70% and 95%, y is in a range of about 0% to 20%, and 1-x-y is in a range of about 0% to 30%; and
a gate stack above the channel stack, wherein the gate stack includes a gate dielectric layer above the channel stack, and a resistive gate contact above the gate dielectric layer, wherein the resistive gate contact includes one or more of silicon (Si) or germanium (Ge), wherein the gate dielectric layer extends into the polarization layer.

* * * * *